Nov. 30, 1954 E. S. BALLARD 2,695,924

ENGRAVING METHOD AND APPARATUS

Filed June 22, 1951 2 Sheets-Sheet 1

INVENTOR
ERNEST S. BALLARD
BY Strauch, Nolan & Diggins
ATTORNEYS

Nov. 30, 1954 E. S. BALLARD 2,695,924
ENGRAVING METHOD AND APPARATUS
Filed June 22, 1951
2 Sheets-Sheet 2
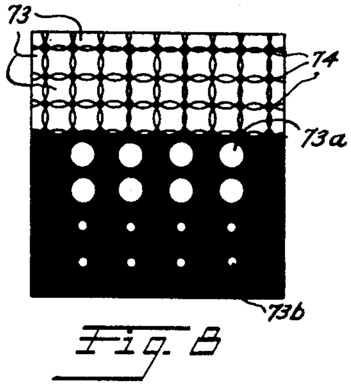
Fig. 8
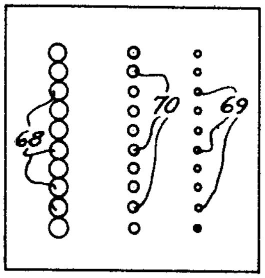
Fig. 6
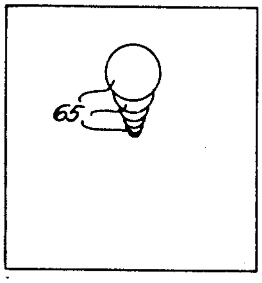
Fig. 7
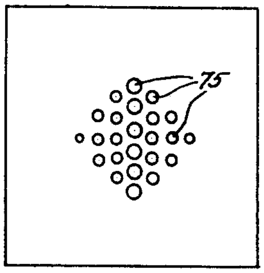
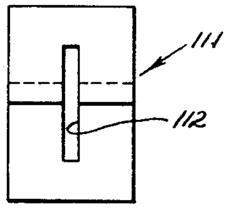
Fig. 4
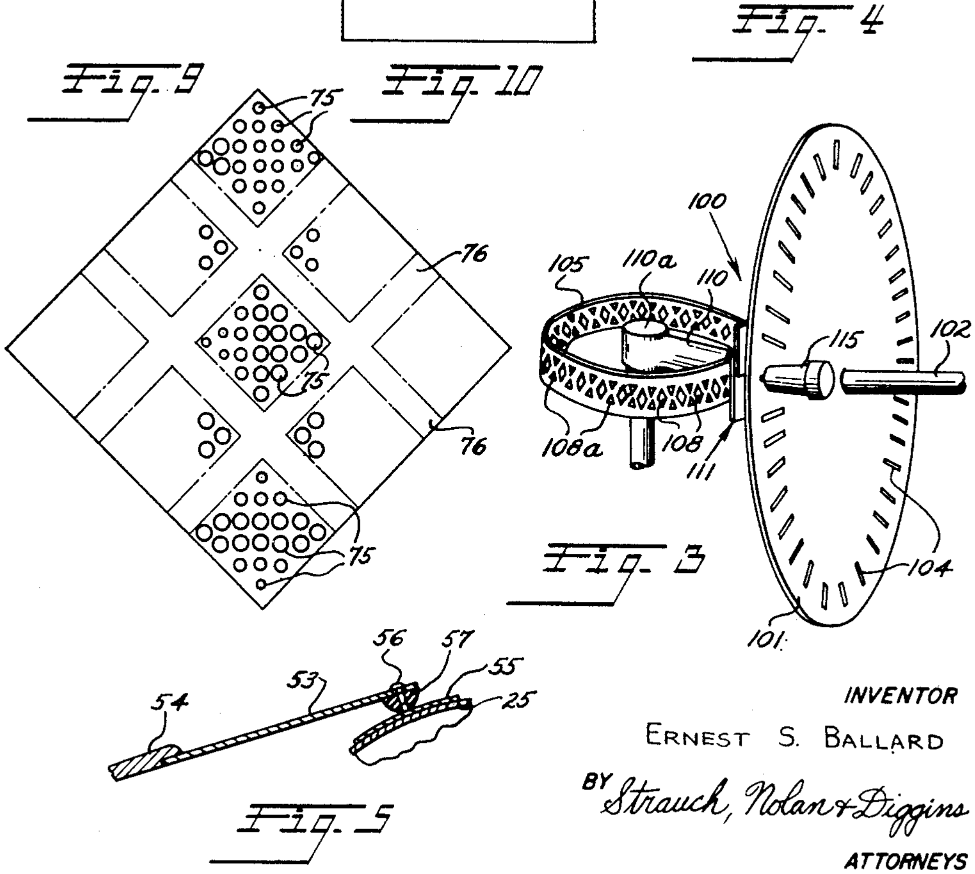
Fig. 9 Fig. 10 Fig. 3 Fig. 5
INVENTOR
ERNEST S. BALLARD
BY Strauch, Nolan & Diggins
ATTORNEYS

United States Patent Office 2,695,924

Patented Nov. 30, 1954

2,695,924

ENGRAVING METHOD AND APPARATUS

Ernest S. Ballard, Sebastopol, Calif.

Application June 22, 1951, Serial No. 233,023

8 Claims. (Cl. 178—6.6)

This invention relates to photo-electric methods and apparatus for engraving, and more particularly to methods and apparatus for modulating an acid resist by electro-chemical action or by electro-mechanical action utilizing the disruptive effect of an electrical discharge at high potential, to alter the resist so that upon etching, an image in intaglio or relief is produced.

This application is a continuation-in-part of my co-pending application Serial No. 167,979 filed June 14, 1950 for Engraving Methods and Apparatus.

According to the practices of making printing surfaces presently known in the art, the fact that colloids, such as gelatin or glue, can be rendered light-sensitive by treatment with a solution of water and ammonium bichromate has been widely utilized. Such colloids are used as thin protective layers covering the metallic surfaces to be etched. Prior to the application of the mordants, a photographic negative or positive as the case may require is brought into close contact with the sensitized surface and subjected to the action of light of high intensity. In consequence, those portions of the sensitized coatings that are not protected by the opaque areas of the photographic medium are rendered insoluble, while the other parts may be developed out or washed away by the application of water or other suitable solvents. An image in resist is thus disclosed with those parts that are to be etched appearing as unprotected metal. After hardening the resist by heating or other effective treatment, mordants are applied to the metallic surface as required. The procedure may give an image in intaglio on the surface of a copper cylinder, as in the commercial roto-gravure process, or as a half-tone or relief formation on a flat plate as in letterpress printing, depending upon the desired method of printing.

In one aspect, the present invention basically contemplates the direct production of an image in a resist by photo-electric means which modulate infinitely brief pulses of electrical energy in accordance with the image to be reproduced and apply them to the resist to create minute controlled perforations in the resist. With the image so formed in the resist the underlying metallic surface may then be etched without further treatment of the resist to produce the desired printing surface, which may be in relief, half-tone, or intaglio as desired. For the purposes of this application, the term "electro-mechanical" has been applied to this method.

Direct production of the images in the resist in accordance with the preferred method of my invention eliminates the steps of applying the conventional carbon tissue resist and its subsequent exposure, development, and retouching, all of which must be performed under rigorously controlled conditions of temperature and humidity by technicians having the highest degree of skill. The elimination of these steps, which constitute the principal expense of prior methods effects a considerable economy.

The invention in another of its important phases contemplates the production of an image in a resist by subjecting the resist, element by element, either before or after exposure to intense illumination to modulated pulses of electrical energy as described above except that the potential of the discharge is kept below a value which will perforate or disrupt the resist. I have discovered that when a sensitized resist is subjected to a controlled discharge of electrical energy in advance of being subjected to the action of light, it becomes insensitive to light in the areas affected by the electrical energy and thus is not rendered insoluble by a subsequent exposure. On the other hand, if the resist is subjected to the controlled discharge of electrical energy after exposure, the discharge of electrical energy instantaneously renders the otherwise insoluble resist soluble in its developers in the areas affected by the electrical energy.

In either case the resist becomes soluble in the developer where it is desired that such solubility is to establish an image consisting of exposed areas, element by element, as more fully described hereinafter.

Whether the image in the resist is produced by electro-mechanical penetration of the resist or by electro-chemical alteration of the resist, the method according to the present invention utilizes almost without change scanning procedure employed in the wire or wireless transmission of photographs. That is to say, brightly illuminated photographic copy is scanned by a photo-cell, the copy being rotated on a cylinder and the cell being moved progressively along the axis of the cylinder. Thus, element by element, the entire area of the photograph or other copy is scanned. The photo-cell is so associated with an amplifying unit that the feeble, fluctuating current which flows through the cell, as a result of the photo-electric action, is greatly intensified and reduced to a form suitable for transmission to the receiving or recording unit, either in the immediate vicinity of a transmitter or at a distance. However, instead of producing merely a photographic reproduction of an original, as in the prior facsimile transmission practice, cylindrical or flat metallic surfaces are delivered ready for immediate etching and subsequent printing in ink both as to pictorial and typographic matter according to the preferred method of the invention. In the second form of the invention a modulated resist is produced which may be developed in accordance with conventional practice.

In accordance with the preferred method of the present invention the resist is called upon to function in a manner quite different from that required by the photo-engraver prior to the final etching in an acid solution. While during the etching operation the resist simply acts as a barrier against erosion where erosion is not desired, in the establishment of the image in the preferred method of the invention, the resist serves as a dielectric or insulating layer that must be penetrated by an electric charge, such penetration being effected in a discriminating manner governed as to size by the tone values of the photograph or other matter which is the source or origin of the image. By utilizing controlled light variation, however, my invention in its broader aspects may also be carried out by utilizing a light sensitive resist instead of the dielectric resist as in the preferred method.

Accordingly, it is the general object and purpose of the present invention to provide improved simplified methods and apparatus for producing printing surfaces by photo-electric means.

It is a further object to provide improved methods and apparatus by which printing surfaces may be produced with greater speed and less skilled labor than is required in present methods and with the quality of the surfaces maintained at least at levels heretofore associated with the much slower processing of the existing gravure and half-tone localized reproduction.

A still further object is to provide improved methods and apparatus for producing a wide variety of novel printing surfaces.

Another object is to provide improved methods and apparatus which may be used with equal effect for producing printing surfaces in the vicinity of the surface to be reproduced, or at points remote from the surface to be reproduced, as for example by telegraphic distribution from a central transmission station of news photographs and other material to be printed in different localities.

It is another object of my invention to provide improved methods and apparatus for producing a plurality of identical printing surfaces simultaneously at remote or adjacent points.

A further object is to provide improved methods and apparatus for producing printing surfaces which eliminate much of the highly skilled labor, and time delay and inertia factors present in methods heretofore known.

A still further object is to provide improved methods and apparatus for producing printing surfaces in which the objectionable effects of factors such as temperature, moisture and variation in resist thickness are effectively minimized, and the skills required to compensate for such factors are eliminated.

It is another object of my invention to provide an improved method for producing printing surfaces in which all of the critical factors affecting the quality of the printing surface are amenable to ready and precise control, thereby assuring uniformity of quality with minimized operational skill requirements.

A more specific object of my invention is to provide methods and apparatus for the production of intaglio, relief, or half-tone cell surfaces in a resistant medium by the application of an electrical discharge to successive minute areas of the resist surface in accordance with a signal generated by a photo-electric cell scanning corresponding minute portions of the surface to be reproduced.

It is another object of the invention to provide improved methods and apparatus by which minute perforations may be made in a resist by an electric discharge, the perforations being subject to accurate control as to size and disposition in the resist.

It is a further object to provide novel methods and apparatus for producing an image in a resist by electro-chemical action.

It is also an object of the invention to provide novel methods and apparatus for rendering selected minute areas of an exposed resist soluble in a developer or for rendering such areas in an unexposed resist insensitive to light by controlled electro-chemical action.

It is also an object to provide novel highly useful printing surfaces comprising major cells of uniform areas in which minor cells of varying character are disposed.

Other objects and advantages will become apparent as the description proceeds in connection with the accompanying drawings in which:

Figures 3–5 illustrate details of the apparatus of Figures 1 and 2; and

Figures 6–10 illustrate the several modulations in the resist produced by the method according to the present invention.

Figures 1, 2:
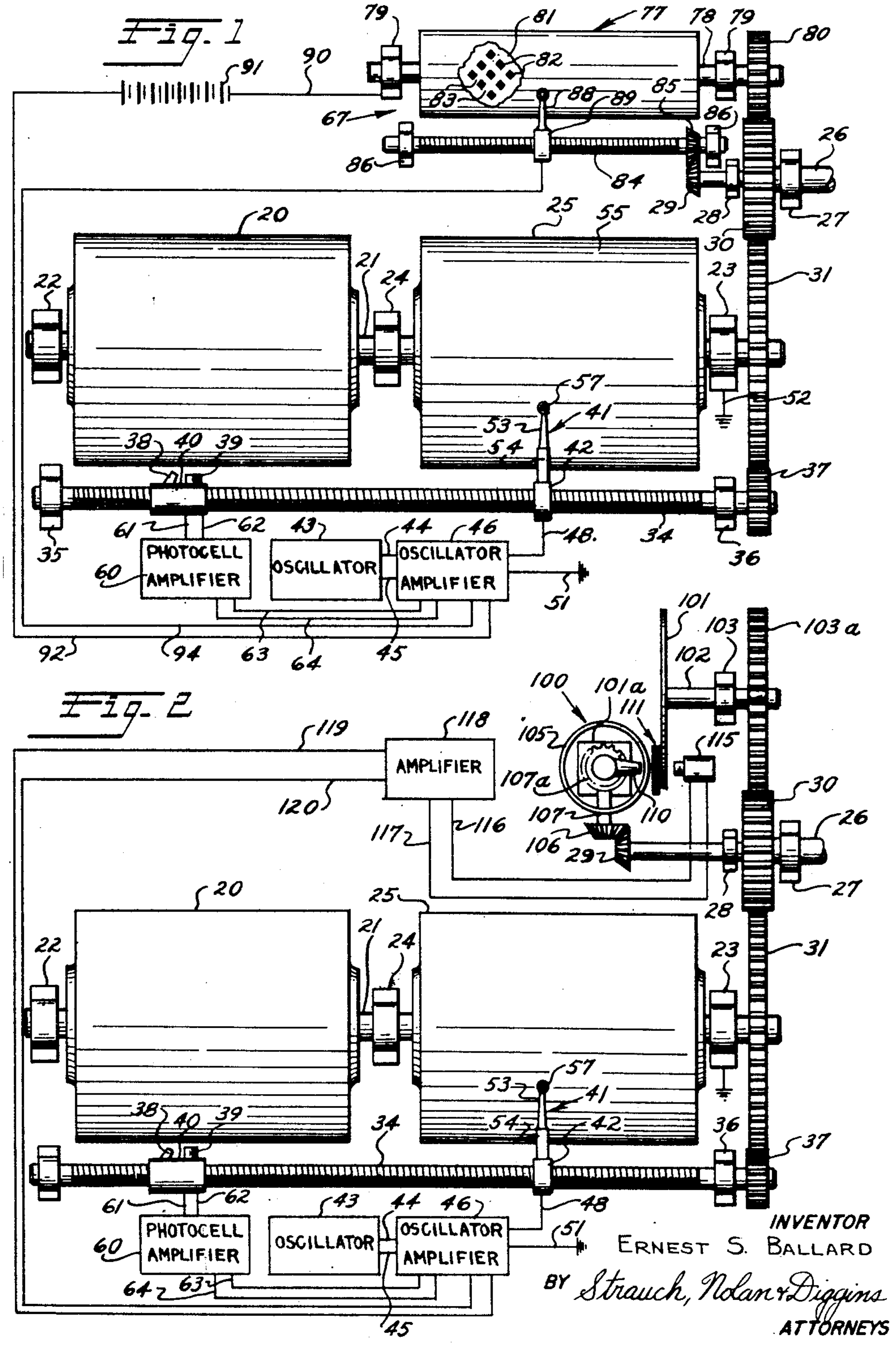
Figure 1 illustrates one embodiment of the apparatus for carrying out the method of the present invention.
Figure 2 illustrates a modification of the apparatus of Figure 1.

Referring to Figure 1, 20 indicates a copy carrying cylinder rigidly mounted on a drive shaft 21 which is journalled in bearing supports 22, 23 and 24 at its ends and mid-point respectively. A resist carrying cylinder 25, which preferably has a highly polished copper surface shell, is removably mounted on shaft 21 in any suitable manner. The construction of cylinder 25 and the method of mounting the cylinder on the drive shaft may take the form disclosed in U. S. Patent 1,831,645. Cylinders 20 and 25, which are of the same diameter, are rotated together at a constant speed by any suitable means, such as a synchronous motor (not shown) attached to shaft 26 which is suitably journalled in supports 27 and 28. Rigidly mounted on shaft 26 are a gear 29 and a driving pinion 30 which meshes with gear 31 rigidly mounted on shaft 21. A feed screw 34, journalled in supports 35 and 36, is driven in predetermined timed relation to cylinders 20 and 25 by a gear 37 which meshes with gear 31. An illuminating lamp 38 and a photo-cell 39 are mounted in a carriage 40 which is positioned on feed screw 34 opposite a portion of the cylinder 20, by means of a threaded support (not shown). A recording stylus, generally indicated at 41, is mounted in a similar carriage 42 and threaded support (not shown) which is positioned on feed screw 34 opposite a corresponding portion of the surface of cylinder 25. Upon rotation of feed screw 34, carriages 40 and 42, carrying lamp 38, and photo-cell 39, and stylus 41, respectively, will advance along feed screw 34 at the same rate.

An undulating potential is supplied to stylus 41 by a fixed frequency oscillator 43, (for example a crystal type oscillator) through leads 44 and 45, amplifier 46, and lead 48. The stylus circuit is completed through a grounded lead 51, amplifier 46, lead 48, stylus 41, cylinder 25, shaft 21, journal 23, and lead 52.

As shown in Figure 5, stylus 41 may be provided at its outer end with a conducting spring 53 mounted on support 54 to form a continuation thereof. A refractory, semi-spherical, button 57, attached to the tip of spring 53, is maintained in resilient engagement with the surface of resist 55 which covers cylinder 25. A conducting pin 56 riveted to spring 53 extends into an aperture in button 57 with its inner end maintained in uniform spaced relation to resist 55 at all times by button 57 as shown in Figure 5. When a potential is applied through spring 53 and pin 56 to the dielectric resist which exceeds the threshold potential of the resist, a discharge will be produced which will penetrate the resist to produce an effect more fully explained hereafter.

Referring again to Figure 1, an amplifier 60 connected by leads 61 and 62 to photo-cell 39 is provided to augment the feeble, fluctuating current produced by the photo-cell 39 as it scans areas of varying light intensity on the surface of the copy mounted on cylinder 20. The output of amplifier 60 is then supplied through leads 63 and 64 to amplifier 46 as a biasing grid voltage to modulate the output of the amplifier in accordance with well known electronic practice. The remaining components of the apparatus of Figure 1, indicated generally at 67, need not be considered at present and will be described in detail hereafter.

The apparatus thus far described may be prepared for operation by placing a photographic negative or positive or other suitable copy on the surface of cylinder 20 and by coating cylinder 25 with a suitable dielectric acid resistant medium, the coating being carried out in accordance with conventional practice. The resist may be selected from a number of lacquers and varnishes but is preferably a so-called "cold top" enamel used by photo engravers consisting of shellac and ammonium carbonate sensitized with ammonium bichromate. The use of the sensitizer plays no part in the present process except that when the resist is exposed to light, it becomes insoluble in an alcoholic solution. In consequence, an aniline dye in solution in alcohol can be applied to the resist without removing the latter from the plate and use of a dye is most helpful in inspecting the image finally established on the resist.

If the cylinders 20 and 25 are rotated and a source of high frequency potential is supplied to stylus 41 by oscillator 43 and its associated amplifier 46, an intermittent discharge of electric energy will be directed against the resist on cylinder 25 from the stylus 41. The individual discharges will be varied in intensity in accordance with the signal generated by the photo-cell 39 as applied to the oscillator amplifier 46. If the cylinder 25 is removed for inspection after a brief period of operation, it will be seen that the electric discharge has penetrated the resist in a series of minute perforations.

The discharge, in penetrating, removes the resist, and bares the metal with absolute precision regardless of the extremely small diameter of many of the penetrations, leaving no residue or "scum" on the underlying plate as is often found where half-tone images in very fine screen formations are produced. The penetrations give no evidence of having been effected by burning through the resist or by the destructive effects of arcing. The minute round holes will be found as clean as though made with a rapidly moving keen-edged drill penetrating to the very bottom of the resist but stopping abruptly upon reaching the surface of the underlying metal. Precise scientific and mathematical interpretation of this phenomenon is not necessary to appreciate its practical utility. However, there is evidence that the penetrations are effected by the kinetic energy of bunched electrons moving at extremely high speed in the order of tens of thousands of miles per second. While the actual mass of the electrons is extremely small, the velocity is so great that the kinetic energy produced takes on ponderable proportions. When it is considered that the area attacked by each discharge is so minute, the force of energy applied per square inch of surface becomes impressive. If the cylinder 25 is etched in accordance with conventional practice, the ratio of surface speed of the resist to the frequency of oscillation of current may be selected so that a multitude of separated perfectly round intaglio cells of varying diameter will be produced, including cells so small that they are detected with difficulty even with the aid of a microscope. It can be seen that every cell, regardless of its size, is perfectly round, indicating that the bunched electrons are aggregations of particles held together in cylindrical form. The cylindrical form of the discharge may be explained by the fact that the moving charges are surrounded by a magnetic field exercising a force upon the charges. The latter logically would be compressed into the smallest possible space, which is a cylindrical form. Furthermore, with increased potential, the number of electrons passing a given point in an exceedingly brief instant of time is increased, accounting for the different diameters as found upon the surface of the plate. These penetrations are of a character to be desired in carrying forward the process of preparing intaglio and similar surfaces by photo-electric means.

In practice, the penetration may be effected by a combination of the energy of the electric charge and the disruptive effects of arcing. The latter must be used with care; otherwise the underlying metal itself may be eroded in advance of etching and delicate effects made difficult. However, for certain types of heavy printing, such as textiles and wall paper, these reactions can be utilized to advantage, particularly if reduced speed of production is not objectionable.

Although the primary cells are round, various combinations of surface speeds and oscillation frequencies can be made greatly to extend the applications of the process.

Referring again to Figure 1, it will be apparent that if the electrical potential applied through stylus 41 is capable of penetrating the resist on the surface of cylinder 25 and is maintained steadily, a fine line will be traced repeatedly around cylinder 25 advancing to the right at the same rate as the scanning cells. If, instead of a steady amplified signal from the photocell, a potential of relatively high frequency should be applied to the stylus 41, a series of penetrations 68 (Fig. 6) would be traced around the cylinder, the number depending upon the frequency of the applied potential and the related speed of rotation of the cyilnder, with the size of the penetrations depending upon the magnitude of the applied potential as illustrated in Figure 6. It will be apparent that the number of penetrations that may be impressed around the resist covered cylinder per revolution may be readily controlled. Likewise, the number of enveloping lines as represented by the penetrations per inch of stylus travel is also amenable to accurate control. As a result of progress made in recent years in electronic controls, great flexibility is available with regard to the ratio of the oscillator frequency to the number of cell penetrations. It is now possible to so regulate the frequency of an oscillator that the frequency becomes constant in extremely narrow limits and may be held there indefinitely. Thus, I take advantage of such controls to determine precisely the number of penetrations as related to the cylinder circumference and the desired number of cells per unit area.

It will be seen that if the amplifier 46, which augments the frequency potential delivered by the oscillator 43 were permitted to deliver a peak potential with every oscillation, the penetrations on the resist would each be of the maximum diameter as shown in enlarged form at 68 at Fig. 6. If such a surface were etched and an intaglio proof taken in a printing press, a very dark uniform tone line would be presented. However, with the intervention of the photocell control a very different result will follow. For example, we may assume that the photocell is scanning an area represented by the side of a white building. This will cause the cell with the aid of an amplifier to deliver a substantial potential which is applied to amplifier 46 as a biasing grid voltage reducing the output of the amplifier to a low value, and in consequence, the penetration energy of each recurring pulse will be correspondingly reduced. Hence, the cells that would follow in an etching operation would be very small and represent a very light intaglio print tone corresponding to that of the side of the white house as illustrated at 69 in Figure 6. Middle tone cells may be of intermediate size as illustrated at 70. It should be noted that the oscillator 43 simply determines the number of pulses per second and in no way affects their power to penetrate the resist. That power is governed entirely by the amplified voltage from the photocell. Response to the photocell in turn is regulated by the light intensity reflected from the copy.

By proper adjustment of oscillator frequency, surface speed, and the magnitude of the applied potential, a cell formation such as shown in Figure 7, consisting of overlapping dots 65, one below the other, to suggest approximately a triangle, may be produced.

If the copy scanned by photocell is a negative, or if a positive is used, and the polarity of the signal generated by the photocell is reversed, the individual cells will vary in size inversely with respect to light intensity of the positive copy. That is, large cells will be produced in highlight areas and smaller cells will be produced in darker areas. It will be understood that in half-tone printing the unetched surface between the cells carries the ink whereas in intaglio printing the cells carry the ink. The half-tone formation is illustrated in greatly enlarged form in Fig. 8 where the printing surface is shown after etching, the shaded areas indicating the ink bearing surface of the plate. At the upper portion of Fig. 8, the cells 73 are shown overlapping leaving very small areas 74 as highlight dots. The lower portion of the figure illustrates two smaller cell sizes 73a and 73b which produce middle tones and deep shadow areas, respectively.

The operation thus far described gives a modulated resist on the surface of cylinder 25, the final step required being that of etching in the long established manner. Thereafter, following the removal of the resist, the cylinder is ready for printing operation.

While individual round cell formations, as illustrated in Figures 6 to 8, can be utilized for printing, diamond-shaped cells, shown in Figures 9 and 10, are more widely used in conventional gravure printing methods. Because of the very small size of the cells which may be almost microscopic in size, producible by my improved methods, a distribution of 1000 cells to the linear inch may be achieved. This may be utilized to create the diamond-shaped cells of roto-gravure by isolating diamond-shaped aggregations of very small round cells 75 by a lattice or grid of unetched metal is illustrated in enlarged form in Figure 9. As here shown in broken lines, the areas 76 compose the lattice and become the boundaries or walls of diamond-shaped cells with their interior structure composed of a mosaic of very small, perfectly round cells 75 obtained by the method described above. Although such assembled round cells are small in size, they vary as to cross-section according to the tone values they represent within the individual cells all within the dominating area of the diamond-shaped boundary. It will be appreciated that these boundary lines do not actually appear in resist or in the etching, the final cell being represented by Figure 10.

Frequently these cells, as employed in the conventional roto-gravure process as now commonly practiced, are in the order of 22,500 per square inch of printing surface and are of nearly the same cross-section regardless of the varying depths of tone they may depict in printing. The tone values commonly arise from the different depths of cells as obtained by etching through a gelatin resist known as carbon tissue. Varying thickness of resist retards to a greater or less degree, the penetrating effect or the perchloride of iron, the mordant ordinarily employed in conventional practice.

According to the present invention, a similar formation is obtainable by proper distribution of the electric pulses as applied to the resist. By properly controlled distribution, each dominating cell, resembling that of conventional roto-gravure is made up of an array of inner, circular cells. If these cells are small, they continue as separate cells even after etching. If large, they break down or merge to form one large cell, approximately diamond-shaped. That there are optional intermediate stages between these two extremes will be readily understood.

This screen formation is preferably obtained by wholly blocking the action of the amplifier 46 at the proper exceedingly small intervals of time.

Referring again to Figure 1, 67 illustrates a mechanism for effecting such blocking action by use of cylinder 77 rigidly mounted on a shaft 78 journalled in bearing 79 and carrying a pinion gear 80 at its outer end which meshes with and is driven by gear 30 in predetermined timed relation with cylinder 25. The surface of cylinder 77 is entirely covered by a uniform intaglio cell formation, a small section of which is shown greatly magnified at 81. Cells 82 are completely filled with a suitable insulating material, while the lattice work 83 between the cells is a low resistance conductor. A feed screw 84, having gear 85 mounted adjacent one end, is journalled in bearings 86. Gear 85 is driven by gear 29 mounted on a reduced extension of shaft 26. A conducting stylus 88 is mounted on a carriage 89 which is positioned on feed screw 84 by means of a suitable threaded support (not shown). Feed screw 84 and cylinder 77 are rotated simultaneously by gears 85 and 80 in predetermined timed relation with feed screw 34 and cylinders 20 and 25. The gear trains are so proportioned that stylus 88 will advance at the same speed as photo-cell 39 and stylus 41, and the surface speeds of cylinders 77 and 20 and 25 will be equal.

Stylus 88 forms a part of a series circuit including cylinder 77, shaft 78, journal 79, conductor or lead 90, battery 91, lead 92, amplifier 46, and lead 94. Stylus 88 is so connected that when contact is made with the uninsulated lattice 83 of cylinder 77, as distinguished from the insulated area 82 of the cell, a biasing potential is imposed upon the requisite element in the amplifier 46, thereby blocking output from the amplifier until stylus 88 is again in contact with the insulated surface of a cell. This process repeats itself and results in generation of the desired lattice formation on the surface of cylinder 25. At all other intervals the amplified voltage governed by the varying grid potentials initiated by photocell 39 is free to modulate the resist with a series of lines made up of chains of minute cells, their cross-section being determined by the degree of modulation of the discharge. This modulation occurs only within the area of each diamond-shaped cell and in turn effects only the individual areas of the very small round cells that compose the much larger diamond-shaped cell areas. This modulation is wholly absent when the formation of the inner round cells is suppressed by the presence of stylus 88 upon an uninsulated area of cylinder 77. Such contact blocks the action of amplifier 46 and prevents delivery of any penetrating energy to stylus 41.

The foregoing arrangement is limited to relatively slow speeds and the problem of wear and the task of constructing the cylindrical surface with its array of several million insulated cells involves serious commercial considerations which are avoided by my improved photoelectric arrangement in which the required control is provided electronically with the use of a very limited number of cell patterns which may be made many times larger than the actual pattern developed upon the resist. By the substitution of such electronic means for mechanical means, the problem of wear may be minimized effectively. If one diamond-shaped pattern could be traced over repeatedly by a stylus with no time allowed for return to starting position, one pattern would be sufficient to produce any number of similar patterns on the surface of cylinder 25. However, some other means must be provided to permit comparable economy. While simplification that would render one unit pattern completely effective would be difficult to attain, a close approximation thereto is illustrated in Figures 2 and 3. With the exception of the blocking mechanism indicated generally at 100, the apparatus illustrated in Figure 2 is identical to that illustrated in Figure 1, above described. Referring now particularly to the blocking apparatus 100, 101 indicates a disc of light, opaque material mounted for rotation with shaft 102, journalled at 103 driven in turn by gear 30 through gear 103*a* rigidly secured to shaft 102. A plurality of evenly spaced slots 104 are provided around the periphery of disc 101 as shown in Figure 3. Rotatably mounted at right angles to disc 101 in a support 101*a* (Fig. 2) is a cylinder 105 rotated in synchronism with disc 101 and cylinders 20 and 25 by gears 29, 106, shaft 107, and suitable gearing indicated diagrammatically at 107*a* (Fig. 2). Cylinder 105 is pierced at regular intervals around its circumference by diamond-shaped openings, 108 and half diamond shapes 108*a*, as shown in Figure 3. 110 indicates a stationary light source mounted within cylinder 105 on support 110*a* (Fig. 3) so as to direct a beam of light outward through openings 108 and 108*a* in cylinder 105. In practice the cylinder 105 and the face of disc 101 are separated slightly at the point where the beam of light from source 110 passes through the unit pattern. Separation is just sufficient to permit the placement of a flat thin metal plate 111 between cylinder 105 and disc 101. Plate 111 is supported by means not shown between cylinder 105 and disc 101 in such a manner that light projected from the source 110 will pass through unit openings 108 and 108*a* in the wall cylinder 105 through a slot 112 in plate 111 and thence successively to openings 104 in disc 101 when said openings are in alignment with slot 112.

To permit adjustment of the length of the slot 112, plate 111 may be made in two overlapping pieces. Minute changes in this dimension can be used to control lagging or leading components in the electronic circuit. It will be understood that the driving mechanisms for cylinders 105 and disc 101 are diagrammatically illustrated only, the exact relative speeds of the rotating components of the blocking mechanism 100 being determined in individual cases in accordance with the particular pattern to be produced on cylinder 25.

A photocell 115 is positioned by any suitable means (not shown) so as to be exposed to the light from source 110 whenever the openings in cylinder 105 and disc 101 are in alignment. The signal thus generated in photocell 115 is transmitted through leads 116 and 117, amplifier 118 and leads 119 and 120, to the oscillator 43, as hereafter explained.

The operation of the blocking mechanism 100 can best be illustrated by reference to a hypothetical example assuming certain speeds and related factors. For example, we may assume a speed of 500 R. P. M. for the cylinders 20 and 25, a cross feed rate of 500 lines per minute for photocell 39 and stylus 41 and a circumferential dimension of 30 inches for cylinders 20 and 25. Further, assuming that it is desired to produce 50 intaglio cells per linear inch of etched surface, it will be seen that 1500 cells will be impressed around the surface of cylinder 25 for every ten revolutions of the cylinder. These diamond-shaped cells are aggregations of very small round cells arranged in parallel rows within the major cell. The number of rows per cell is constant, although the size of the minor round cells composing the rows may vary from maximum to minimum, determined by the influence of the modulating photocell 39. Since the area occupied by the diamond-shaped cells is surrounded by an area made up of the lattice between the cells, where the cell ratio is 50 cells to the inch and the number of circumferential lines 500 to the inch, each unit consisting of one cell and its related part of the lattice area is traversed by ten circumferential rows of circular penetrations in the resist.

Assuming that cylinder 105 has 100 unit openings spaced around its circumference, one revolution of the cylinder will bring 100 such openings before the projection end of the light source 110. Since a cylinder upon which the etchable image is to be impressed has 1500 cells around a circumferential line, to duplicate that formation, 15 revolutions of cylinder 105 will be required for each revolution of cylinder 25. Since there are 50 cells to the inch measuring in an axial direction along cylinder 25, for every inch of travel of the photocell 39 and stylus 41 it will be necessary for cylinder 105 to revolve 750 times. As cylinder 105 contains 100 "windows," 75,000 "windows," will pass behind the slotted plate 111 during one minute of operation. Since one unit formation consumes ten lines, ten slotted openings in the marginal area of disc 101 must pass in front of slot 112 in plate 111 while one unit opening and related lattice area on cylinder 105 are passing behind the slotted plate 111. It follows that 750,000 slots along the marginal area of disc 101 (all such slots being perpendicular to the slot in plate 111) must pass slot 112 during one minute of machine performance. Assuming that disc 101 has 100 slots around its periphery, the proper speed of the disc 101 will be 7,500 R. P. M.

When a window in cylinder 105 is in alignment with the beam of light of source 110 and disc 101 is rotated, a small rectangle of light will appear repeatedly at one end of slot 112 in plate 111 and pass to the other end of the slot, disappearing at that point. Since at that moment the following slot in the disc appears at the top of the slot in the plate, the effect will be that of a rectangle of light repeatedly traversing the slot in a given direction. If this continuous flow of light were impressed upon photocell 115, the response would be steady, and a constant potential would be maintained by the amplifier 118. However, light source 110 does not deliver an uninterrupted beam to photocell 115, for the unit patterns or windows in the cylindrical side of cylinder 105 repeatedly intervene between the concentrated light from the source 110 and slot 112 in plate 111. As a result, a small intense rectangle of light travels over each cell pattern precisely as the stylus contacts such a moving pattern in the case of the monitoring cylinder 77 described in connection with Figure 1 in which stylus 88 blocks the action of the amplifier 46 by causing an opposing potential to act upon the proper element of the amplifier whenever the stylus is in contact with the conducting lattice on the surface of cylinder 76. However, in the present instance, the electric potential is generated as a result of the signal that comes from the cell pattern rather than from the lattice. In this case, the potential may be reversed as to polarity so as to block the action of amplifier 46 only when the lattice is passing before the slot 112 by the utilization of conventional electronic circuits.

As previously explained, the function of the blocking apparatus 100 is not to determine the number or cross-section of the minute round cells appearing within the major diamond-shaped cell but to fix the very brief intervals when penetration of the resist is suppressed, resulting in the establishment of the desired lattice as previously defined. The major cells generated by this action do not approach geometric perfection or appear with sides sharply defined as straight lines. Rather, a ragged edge of generally irregular form will be produced. These irregularities tend to obliterate any undesired screen effects and are generally highly desirable in the production of the suitable pictorial effect.

When the image has been established on cylinder 25 by the foregoing methods, cylinder 25 is removed from the recording apparatus and etched with suitable mordants. Those major cell areas that are made up cell by cell of numerous relatively large interior round cells, which may at times overlap, will etch rapidly, the larger interior cells merging into each other to produce a diamond-shaped cell without interior partitions. Such a cell will give a heavy dark area in printing. Major cells made up of somewhat smaller interior cells will retain an interior partition structure and, consequently, will print as middle tones. Major cells composed of very small, well-separated, interior cells which are not broken down in etching, will provide highlights and upper tints in the final printing operation. Thus, a cell structure very closely approximating that secured by the use of carbon tissue in the conventional rotogravure process is secured.

The alternative method of my invention by which an image is produced in the resist by electro-chemical action rather than by the electro-mechanical action described above may utilize any form of the above described apparatus without change.

In carrying out the alternative method, the cylinder 25 is coated with a resist, for example a cold-top enamel as described above. However, the resist covered cylinder is not exposed to high intensity illumination. Preferably the coating operations and the subsequent handling of the cylinder are carried out in a subdued light. After the cylinder is coated with a suitable sensitized resist, the cylinder 25 is placed in its proper operating position in the above described apparatus and the desired areas of the resist are traversed by the energized stylus 41. However, the potential of the discharge from the stylus 41 onto the resist 55 is kept much lower than that used where the energy of the charge is relied upon to perforate the resist. A potential in the order of 1,000 volts, or lower, has been found to be sufficient to secure the desired reaction.

If the discharge from the stylus 41 is in a form of unmodulated high frequency pulses a series of dark brown or nearly black lines surrounding the cylinder will be formed in the resist. A microscopic examination of the resist will disclose that these lines are made up of closely associated dots in chain formation similar to the lines of clean perforations described in connection with Figure 6 above. However, it will be noted that the resist has not been penetrated in the manner described above. While some evidence of physical and chemical changes will be found, no significant uncovering of the underlying metal of the surface of cylinder 25 will be found.

After being subjected to the electrical discharge, the cylinders are removed from the apparatus and rotated in front of a strong source of illumination such as an arc lamp by any conventional means. The exposure is continued for the period normally associated with the proper exposure of the particular resist or enamel. Thereafter, the cylinder is developed in accordance with conventional practice. It will be seen from an inspection of the developed resist that all the areas which have been subjected to the minute electrical discharges have been developed out perfectly exhibiting a cell formation determined as to number of cells per unit of circumference by the frequency of the applied electrical impulses and the related speed of revolution of the cylinder 25 as described above. The cylinder is then etched in accordance with conventional practice. The etched cylinder will be found to have clean ordered cell formations very closely paralleling those effected by the high potential discharge described above.

I have discovered that substantially the same final result may be achieved if the resist is exposed to a source of intense illumination before being subjected to the electrical discharges. That is, the areas subjected to the electrical discharges which had been rendered insoluble by the exposure to light are instantaneously rendered soluble in the alcoholic development.

It is apparent, then, that the reaction is, in a sense, reversible. Thus when a sensitized resist is traversed by the energized stylus in advance of being subjected to the action of light, it becomes insensitive to light wherever the stylus has tracked. On the other hand, if the action of the energized stylus follows the exposure of a sensitized resist, the action of the stylus instantaneously renders the otherwise insoluble resist soluble in its developer in the areas effected by the electrical energy.

In either case the resist becomes soluble in the developer where it is desired that such solubility is to establish an image consisting of exposed areas of metal which may be etched to produce the final printing surface.

While the chemical and physical changes which are produced in the resist are extremely complex and not fully understood it is evident that the highly useful effect of the passage of the current is to finally render soluble only those portions of the resist that are to be removed to render the proper pictorial values upon etching the metallic surface of the cylinder.

As in the previously described method by which the resist was actually perforated, the present electro-chemical modification of the resist is governed as to area by the intensity of the discharge. This is evident from the fact that there is no apparent tendency for the effects of the discharge to spread beyond exceedingly close limits. Each cell, after development is separated from that following by a narrow bridge of resist less than .001 of an inch in width. Upon etching with the proper mordants, these minute divisions or barriers withstand the erosive action perfectly and are thus extremely useful in the production of printing surfaces of the highest quality.

While for the purpose of illustration, commercial cold-top resist has been described, I have found that the reaction is not confined to this type of resist. The egg albumen resist, the conventional "glue top" resist, and other combinations respond in a similar manner. Either potassium bichromate or ammonium bichromate may be used interchangeably as the sensitizer without significantly affecting the process.

The methods above described in connection with the creation of an image in the immediate vicinity of the copy may be readily adapted for the simultaneous production of any number of identical images at points adjacent to or remote from the copy. For example, the copy cylinder, photocell, oscillator, amplifiers and the blocking mechanism may be situated in a transmitting station, and a number of recording cylinders and styli may be situated in remote receiving stations. Any number of images can thus be produced locally or at remote points, utilizing well known techniques of wire or wireless transmission and synchronization.

As a further indication of the flexibility of the method it is to be noted that images of different sizes may be produced simultaneously by the utilization of different diameters and separate properly timed driving means for the recording cylinders and styli. Also several recording cylinders may be coupled in tandem and the resist on each cylinder processed simultaneously by the action of one scanning cell and control system. Duplicate cylinders may thus be produced which may be used as replacement for damaged or lost cylinders. If the unetched reserve cylinders are not used, the resist may be removed and replaced with a fresh resist for a new operation in a matter of minutes.

It will be apparent from the foregoing that the herein disclosed electro-mechanical and electro-chemical apparatus and methods for producing printing surfaces is based on the fact that electrical energy can be utilized to modulate resists in a manner that will, after etching the metal upon which the resist has been placed, present any desired arrangement of round cells varying over a wide range as to size and depth.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. Apparatus for producing an image in acid resistant media comprising, in combination; a first surface to be reproduced, an acid resistant second surface, a light sensitive electronic means adapted to produce a varying potential, means for discharging electrical energy, means for moving said light sensitive means and said device for discharging electrical energy incrementally over said first and second surfaces, respectively, in timed relation, means to control said discharge means in accordance with the varying potential produced by said light sensitive device, and means electrically connected to said control means to periodically render said varying potential ineffective to control said discharge means.

2. Apparatus for producing an image in acid resistant media comprising, in combination; a first surface to be reproduced, an acid resistant second surface, means for penetrating said second surface with perforations of varying cross-section, a light sensitive means associated with said first surface adapted to produce a varying control signal, means responsive to said control signal to regulate the said penetrating means and thereby vary the cross-section of said penetrations, and means for periodically rendering said control signal ineffective.

3. In apparatus for perforating acid resistant media in a predetermined pattern by the disruptive action of an electrical discharge device; means for supplying a potential to said electrical discharge device, a control circuit for said means, said control circuit including a pair of relatively movable contactors, one of said contactors having a surface configuration corresponding to said predetermined pattern.

4. In apparatus for perforating acid resistant media in a predetermined pattern by the disruptive action of an electrical discharge device; means for supplying a potential to said electrical discharge device, a control circuit for said means, said control circuit including a light sensitive means adapted to produce a control potential when exposed to light, a light source, and movable means adapted to control the passage of light from said source to said light sensitive means, said movable means having transparent and opaque areas arranged along its surface corresponding with the said predetermined pattern.

5. Apparatus for creating an image in acid resistant media comprising, in combination; a copy carrying cylinder; a resist covered cylinder; a control cylinder; means to rotate said cylinders in timed relation; an electronic light sensitive device adapted to produce a varying potential, an electric discharge device and a control device positioned adjacent corresponding elements of said copy carrying cylinder, resist covered cylinder and control cylinder, respectively; means to advance the respective devices along the axis of the cylinders with which they are associated in predetermined timed relationship; means to supply said discharge device with a high frequency variable potential; means to vary the magnitude of the said high frequency variable potential in accordance with the potential produced by the light sensitive device; and means responsive to the relative movement of said control cylinder with respect to said control device to periodically interrupt said high frequency potential.

6. Apparatus for producing an image in an acid resistant media comprising a combination; a first surface to be reproduced, an acid resistant second surface, electrical discharge means for rendering selected portions of said second surface soluble in acid, a light sensitive means associated with said first surface adapted to produce a varying control signal, and means responsive to said control signal to regulate said electrical discharge means and thereby vary the area of said selected portions.

7. In apparatus for establishing soluble areas in a predetermined pattern in a normally acid resistant media by the action of an electrical discharge device; means for supplying a potential to said electrical discharge device, a control circuit for said means, said control circuit including a pair of relatively movable contactors, one of said contactors having a surface configuration corresponding to said predetermined pattern.

8. In apparatus for establishing soluble areas in a normally acid resistant media in a predetermined pattern by the action of an electrical discharge device; means for supplying a potential to said electrical discharge device, a control circuit for said means, said control circuit including a light sensitive means adapted to produce a control potential when exposed to light, a light source, and movable means adapted to control the passage of light from said source to said light sensitive means, said movable means having transparent and opaque areas arranged along its surface corresponding with the said predetermined pattern.

References Cited in the file of this patent

UNITED STATES PATENTS

| Number | Name | Date |
|---|---|---|
| 1,702,595 | Cooley | Feb. 19, 1929 |
| 1,719,392 | Cooley | July 2, 1929 |
| 2,113,582 | Eitzen | Apr. 12, 1938 |
| 2,260,511 | Cooley | Oct. 28, 1941 |
| 2,398,779 | Dation et al. | Apr. 23, 1946 |